(12) United States Patent
Yasutake

(10) Patent No.: US 7,943,844 B2
(45) Date of Patent: May 17, 2011

(54) THERMOELECTRIC MODULE AND MANUFACTURING METHOD FOR SAME

(75) Inventor: Hidetoshi Yasutake, Hamamatsu (JP)

(73) Assignee: Yamaha Corporation, Shizuoka-ken (JP)

( * ) Notice: Subject to any disclaimer, the term of this patent is extended or adjusted under 35 U.S.C. 154(b) by 1275 days.

(21) Appl. No.: 11/351,117

(22) Filed: Feb. 10, 2006

(65) Prior Publication Data

US 2006/0180191 A1  Aug. 17, 2006

(30) Foreign Application Priority Data

Feb. 15, 2005  (JP) ................ P2005-037767

(51) Int. Cl.
*H01L 35/28* (2006.01)
(52) U.S. Cl. ............... 136/224; 228/180.21; 228/180.22
(58) Field of Classification Search ............. 228/180.21, 228/180.22
See application file for complete search history.

(56) References Cited

U.S. PATENT DOCUMENTS

2005/0241690 A1  11/2005 Tajima et al.

FOREIGN PATENT DOCUMENTS

| JP | 2003-100983 | 4/2003 | |
|---|---|---|---|
| JP | 2004-140250 | 5/2004 | |
| JP | 2004193355 A * | 7/2004 | ........ 136/200 |
| JP | 2005-136075 A | 5/2005 | |

OTHER PUBLICATIONS

Nagasaki, Koichi, Thermoelectric Module, JP2004193355A machine translation, Jul. 8, 2008.*
Okuda, Yashuhiro, Ceramic Substrate for Thermoelectric Exchanging, JP 2004150250 machine translation, May 13, 2004.*

* cited by examiner

*Primary Examiner* — Alexa D Neckel
*Assistant Examiner* — Miriam Berdichevsky
(74) *Attorney, Agent, or Firm* — Dickstein Shapiro LLP

(57) ABSTRACT

A thermoelectric module and method of manufacture thereof, capable of preventing short-circuits between electrodes due to solder without causing increases in size or cost. A thermoelectric module is configured with lower electrodes formed on the inside surface of a lower substrate, placed in opposition to an upper substrate, on the inside surface of which are formed upper electrodes; the end faces of thermoelectric elements are soldered to the lower electrodes and upper electrodes. Each of the electrodes is configured from three layers, which are a copper layer, a nickel layer formed on one face of the copper layer, and a gold layer formed on one face of the nickel layer; a visor portion, protruding outward, is formed in the nickel layer, so that when positioning the thermoelectric elements above the electrodes and soldering the electrodes to the thermoelectric elements, the flowing of solder 18a from the side portions of electrodes to the insulating substrate is prevented.

6 Claims, 8 Drawing Sheets

THERMOELECTRIC MODULE AND MANUFACTURING METHOD FOR SAME

BACKGROUND OF THE INVENTION

1. Field of the Invention

This invention relates to a thermoelectric module which performs thermoelectric conversion, and to a manufacturing method for same.

Priority is claimed on Japanese Patent Application No. 2005-37767, filed Feb. 15, 2005, the content of which is incorporated herein by reference.

2. Description of Related Art

Thermoelectric modules, which utilize the Peltier effect and the Seebeck effect in thermoelectric power conversion, have conventionally been used in heating and cooling equipment and other applications. Such thermoelectric modules are configured by forming multiple electrodes at prescribed locations on the opposing inside surfaces of a pair of insulating substrates, and by soldering the upper and lower ends of thermoelectric elements to the opposing electrodes, to fix in place multiple thermoelectric elements between the pair of insulating substrates.

Among such thermoelectric modules, there are devices having a structure which prevents the occurrence of short-circuits across electrodes due to the flow of solder in the molten state on the insulating substrates when soldering the thermoelectric elements to the electrodes. Among these devices, there are thermoelectric modules in which electrodes are configured from three layers, which are a copper layer, a nickel layer formed over the entire surface of the copper layer, and a metal plated layer of gold or similar formed on the upper surface (the upper surface when forming the electrodes) of the nickel layer, and in which the nickel layer which has less solderability is exposed on the side surfaces of the electrodes (see for example, Japanese Unexamined Patent Application, First Publication No. 2004-140250).

There are also devices in which grooves are provided between the electrodes on the insulating substrates, to prevent the flow of solder in the molten state onto other electrodes (see for example, Japanese Unexamined Patent Application, First Publication No. 2003-100983).

However, of the above-described thermoelectric modules, the former entails the difficulty of processing to cause the nickel layer to be exposed on the side faces of the electrodes, as a result of which there are the problems that the number of processes is increased, production yields are lowered and manufacturing times lengthened, and in addition costs are increased. In methods to manufacture such thermoelectric modules, prior to removal by-etching of the unwanted portions of the metal plated layer (the side-face portions of the electrodes), resist is formed on the upper surface of the metal plated layer; and there is the problem that during this processing, a shift in the electrodes and mask causes resist to touch the side faces of electrodes, giving rise to short-circuits.

Further, in the case of the latter thermoelectric modules of the prior art, grooves are formed between the electrodes on the insulating substrates respectively, so that the distances between electrodes are increased, and there is the problem that the thermoelectric modules are increased in size (with reduced densities). Moreover, because grooves are formed, the number of processes is increased, production yields are lowered and manufacturing time is prolonged as well as increased costs.

The present invention was devised in order to address the above-described problems, and has as an object the provision of a thermoelectric module and manufacturing method for a thermoelectric module capable of preventing short-circuits between electrodes due to solder, without resulting in increases in size or cost.

SUMMARY OF THE INVENTION

In order to attain this object, a thermoelectric module of this invention is configured by forming electrodes at prescribed locations on the opposing inside surfaces of a pair of insulating substrates, arranged in opposition, and by soldering the end faces of a plurality of thermoelectric elements to the respective opposing electrodes, to fix the thermoelectric elements between the pair of insulating substrates, and is characterized in that a visor portion, protruding outward, is formed on the edge portion of the thermoelectric element-side portion of the electrodes, and when thermoelectric elements are positioned on the upper sides of electrodes and electrodes soldered to thermoelectric elements, the solder is prevented from flowing from the side portions of the electrodes to the insulating substrates.

In a thermoelectric module of this invention configured in this way, an outward-protruding visor portion is formed on the upper-end edge portions (the portions on the upper side when performing solder treatment) of electrodes to be fixed to thermoelectric elements with solder; hence when using solder to fix the lower-end portions of thermoelectric elements to the upper faces of electrodes positioned on the upper surface of an insulating substrate, molten-state solder which has overflowed from bonded portions accumulates on the upper faces and side faces of the visor portions.

As a result, events in which the solder flows as far as the insulating substrate surface, making contact with solder which has flowed from other electrodes and causing short-circuits between electrodes, can be prevented. Further, when fixing the other end portions of thermoelectric elements to electrodes formed on the other insulating substrate also, with the insulating substrate positioned below, by fixing the lower end portions of the thermoelectric elements to the upper faces of electrodes positioned on the upper surface of the insulating substrate, flowing of solder to the insulating substrate can be prevented.

Other configuration characteristics of a thermoelectric module of this invention are the formation of electrodes from a plurality of layers consisting of metal layers of different types, and the formation in the visor portion of a metal layer with less solderability with respect to the solder, among the metal layers making up the plurality of layers.

Here, the less solderability with respect to solder generally indicates a property of strongly repelling solder. In this invention, "less solderability" is taken to mean that, in tests in conformance with JIS C 0053 (1996), the time interval A-t0 (known in the industry as the zero-cross time) stipulated is 3 seconds or longer. This test is performed by plotting, against time, the change in force when a specimen-is immersed in molten solder; the zero-cross time is the time from the start of immersion of the specimen in the solder vat, until the state in which the force with which the specimen is pushed upward from the solder vat is in equilibrium with the force pulling the specimen into the solder vat (force due to solderability).

By forming a visor portion in this metal layer with less solderability, flowing of solder in the molten state past the visor portion from the side faces of electrodes to the side of the insulating substrate can be prevented more reliably. Further, in this case the layer in which the visor portion is formed is not limited to the uppermost layer among the plurality of layers, but can be any metal layer in a position in which a visor portion can be formed in a state maintaining a prescribed interval from the insulating substrate. Metals having less solderability with respect to solder include nickel and magnesium. Conversely, metals having good solderability with respect to solder include gold, tin, tin alloys (tin-antimony, tin-bismuth, tin-copper, tin-copper-silver) and similar.

Still another configuration characteristics of a thermoelectric module of this invention is the configuration of electrodes from three layers, which are a copper layer formed on one face of the insulating substrate, a nickel layer formed on one face of the copper layer, and a gold layer formed on one face of the nickel layer, and with the visor portion formed in the nickel layer.

Because of its superior conductivity, copper is widely used in electrodes, and because of its superior solderability with respect to solder, gold is appropriate as the surface layer of electrodes when an electrode is to be fixed to a thermoelectric element by means of solder. And by forming a layer of nickel, with less solderability with respect to solder, between the copper layer and the gold layer, causing the edge portion of the nickel layer to protrude so as to form a visor portion, flowing of molten-state solder to the side of the insulating substrate can be reliably prevented. In this case, the peripheral portion of the gold layer may be formed to protrude toward the outside together with the nickel layer visor portion; however, the side portion of the visor portion must be exposed without being covered.

Still another configuration characteristics of a thermoelectric module of this invention is the configuration of electrodes from a single layer consisting of a metal layer of one type. In this case the metal used in the metal layer is required to have superior conductivity and also to have less solderability with respect to solder, and so it is appropriate that nickel or magnesium be used. By this means, although the strength of adhesion of electrodes and thermoelectric elements due to the solder is somewhat weaker, the reliability with which short-circuits between electrodes due to solder can be prevented is increased. Further, because the number of processes for forming electrodes is reduced, thermoelectric modules can be easily manufactured, and costs can be reduced. Still another configuration characteristics of a thermoelectric module of this invention is the setting of both the thickness of the base end and protrusion length of the visor portion to 1 μm or greater. Here, the base end of the visor portion is the border portion between the main portion of the electrode and the visor portion. By this means, when soldering electrodes and thermoelectric elements, the visor portion can be ensured to be sufficiently strong and long enough to prevent the flow of molten solder.

A method of manufacture of thermoelectric modules of this invention, in which electrodes are formed in prescribed locations on the opposing inside surfaces of a pair of insulating substrates, arranged in opposition, and the end faces of a plurality of thermoelectric elements are soldered to the respective opposing electrodes, to fix in place the thermoelectric elements between the pair of insulating substrates, is characterized in having a resist layer formation process of forming a resist layer on one surface of the insulating substrates; an exposure process of exposing the surface of the resist layer, in a state of masking prescribed portions of the surface of the resist layer formed in the resist layer formation process; a development process of removing the masked portions in the resist layer through development of the resist layer exposed in the exposure process; an electrode formation process of forming electrodes, consisting of a plurality of metal layers, between the resist layer of prescribed shape formed in the development process; a resist layer removal process of removing the resist layer of prescribed shape; and, an visor formation process of removing a portion of the side portion of a metal layer on the insulating substrate side, among the plurality of metal layers of the electrodes, to form a visor portion on the edge portion of the electrodes.

By this means, a simple method can be used to obtain a thermoelectric module in which the flowing of solder to the insulating substrates is prevented, and short-circuits between electrodes due to solder do not occur. The resist layer formed in the resist layer formation process is not limited to direct formation on one surface of the insulating substrates, but may be formed via a prescribed seed layer. When forming a seed layer, this seed layer is removed by ion beam etching after removal of the resist layer.

In this case, the visor portion can be formed in the metal layer with less solderability with respect to solder among the plurality of metal layers making up the electrodes formed in the electrode formation process. Further, the electrodes formed in the electrode formation process can consist of three metal layers, which are a copper layer formed on one surface of the insulating substrates, a nickel layer formed on one surface of the copper layer, and a gold layer formed on one surface of the nickel layer, and the visor portion can be formed in the nickel layer.

Another method of manufacture of thermoelectric modules of this invention, in which electrodes are formed in prescribed locations on the opposing inside surfaces of a pair of insulating substrates, arranged in opposition, and the end faces of a plurality of thermoelectric elements are soldered to the respective opposing electrodes, to fix in place the thermoelectric elements between the pair of insulating substrates, is characterized in having a resist layer formation process of forming a resist layer on the upper surfaces of the insulating substrates; an exposure process of exposing the surface of the resist layers, in a state of masking prescribed portions of the surface of the resist layers formed in the resist layer formation process; a development process of removing the masked portions in the resist layers through development of the resist layers exposed in the exposure process; an electrode formation process of forming electrodes, in which the top-end edge portion is formed into a visor portion, between the resist layer formed into a prescribed shape in the development process and in a portion of the surface of the resist layer; and, a resist layer removal process of removing the resist layer of prescribed shape.

By this means, a simple method can be used to obtain a thermoelectric module in which the flowing of solder to the insulating substrates is prevented, and short-circuits between electrodes due to solder do not occur. In this case, electrodes formed in the electrode formation process may be configured from single layers consisting of a single type of metal layer, or may be configured from a multilayer film consisting of a plurality of metal layers.

BRIEF DESCRIPTION OF THE DRAWINGS

FIG. 5A-D shows processes for formation of electrodes, in which FIG. 5A is a cross section of resist, FIG. 5B is a cross section showing the state in which a copper layer, nickel layer, and gold layer are formed within the resist; FIG. 5C is a front view showing the state in which resist has been removed; and, FIG. 5D is a front view showing the state of formation of an electrode;

FIG. 9A is a cross-sectional view of resist, FIG. 9B is a cross-sectional view showing the state of formation of electrodes consisting of a copper layer in resist, and FIG. 9C is a front view showing the state of formation of an electrode with the resist moved; and, FIG. 10 is a cross-sectional view showing an electrode with a thermoelectric module in still another embodiment.

DETAILED DESCRIPTION OF THE INVENTION

Figure 1:
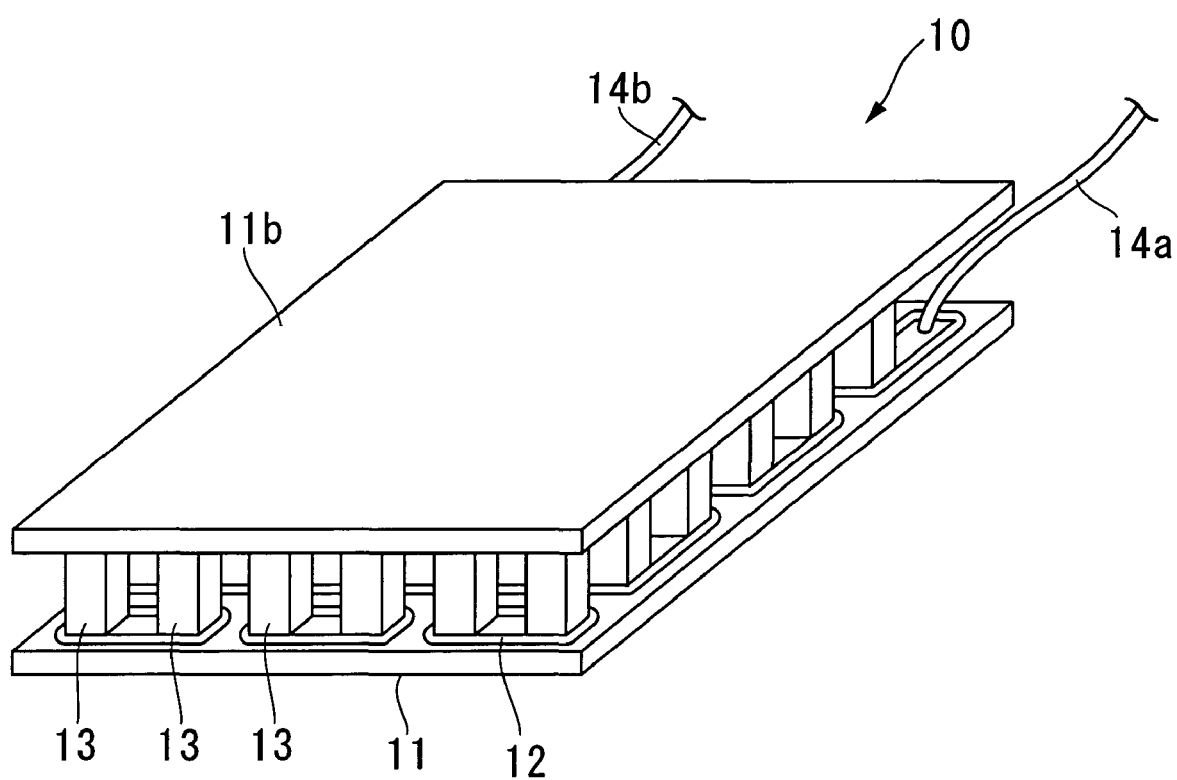
FIG. 1 is an oblique perspective figure showing the thermoelectric module of one embodiment of the invention.
Figure 2:
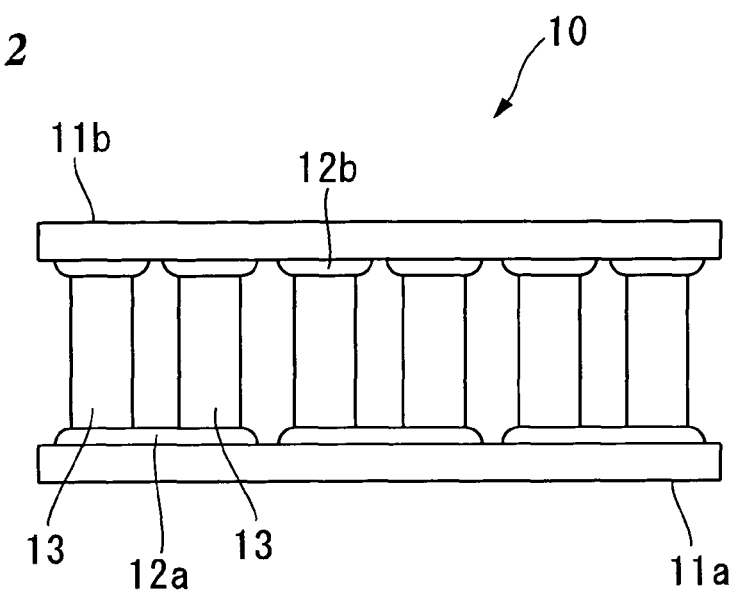
FIG. 2 is a front view of the thermoelectric module shown in FIG. 1.

Hereinafter, embodiments of the present invention are explained referring to the drawings. FIG. 1 and FIG. 2 show a thermoelectric module 10 of one embodiment. This thermoelectric module 10 has a pair of insulating substrates, which are a lower substrate 11a and an upper substrate 11b; lower electrodes 12a are formed in prescribed positions of the upper surface of the lower substrate 11a, and upper electrodes 12b are formed in prescribed positions of the lower surface of the upper substrate 11b. The lower-end faces of multiple thermoelectric elements 13, consisting of chips, are fixed in place to the lower electrodes 12a by solder; and, the upper-end faces are fixed with solder to the upper electrodes 12b respectively, to integrally link the lower substrate 11a and the upper substrate 11b.

The lower electrodes 12a and upper electrodes 12b are installed at positions shifted distances equal to substantially the width of one of the thermoelectric elements 13. Upper electrodes 12b are bonded to the upper-end faces of two thermoelectric elements respectively while there are two types of lower electrodes 12a, one is bonded to the lower-end face of only one thermoelectric element 13, and another is bonded to the lower-end faces of two thermoelectric elements 13. Lower electrodes 12a to which the lower-end face of only one thermoelectric element 13 is bonded are provided in two corner portions on one side (the rear-end portion in FIG. 2) of the lower substrate 11a; lead wires 14a, 14b are connected to the rear-side portions of these lower electrodes 12a, enabling connection to external equipment.

The lower substrate 11a and upper substrate 11b consist of sheets of alumina; the thermoelectric elements 13 consist of alloy derived from bismuth-tellurium and are formed in a rectangular parallelepiped shape. Each of the thermoelectric elements 13 is electrically connected to the substrates via the lower electrodes 12a and upper electrodes 12b. The lower-end faces of the thermoelectric elements 13 and lower electrodes 12a, the upper-end faces of the thermoelectric elements 13 and the upper electrodes 12b, and the rear-side portions of the lower electrodes 12a formed in edge side of the lower substrate 11a and the lead wires 14a, 14b, are respectively fixed in place using solder.

Figure 3:
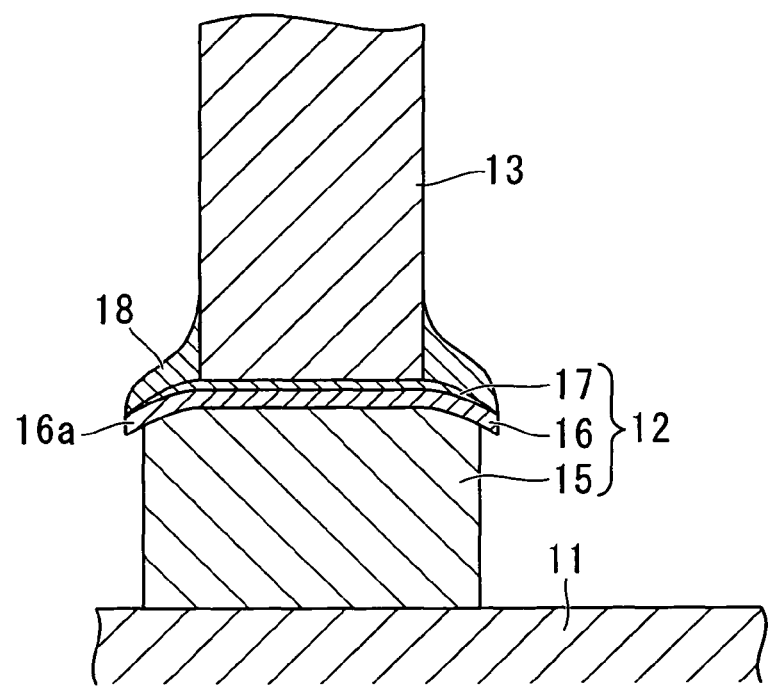
FIG. 3 is a cross section showing the state of an insulating substrate fixed to a thermoelectric element via an electrode.

The lower electrodes 12a and upper electrodes 12b are formed into substantially the same shape, configured as shown in FIG. 3. In the following explanations, the lower electrodes 12a and upper electrodes 12b are both described as electrodes 12, and the lower substrate 11a and upper substrate 11b are both described as insulating substrates 11. The electrodes 12 are configured as three metal layers, which are a copper layer 15 formed on the upper surface of the insulating substrate 11, a nickel layer 16 formed on the upper surface of the copper layer 15, and a gold layer 17 formed on the upper surface of the nickel layer 16.

On the periphery of the nickel layer is formed a visor portion 16a, protruding outward from the outer-circumference face of the copper layer 15, so that a step is formed between the nickel layer 16 and the copper layer 15. The gold layer 17 is formed on the upper surface of the nickel layer 16, in a state which causes the portion in proximity to the side face at the side-face portion and upper face of the nickel layer 16 to be exposed slightly. By using solder 18 to bond the upper face of the electrode 12 to the lower-end portion of the thermoelectric element 13, the electrode 12 and thermoelectric element 13 are fixed in place.

Figure 4:
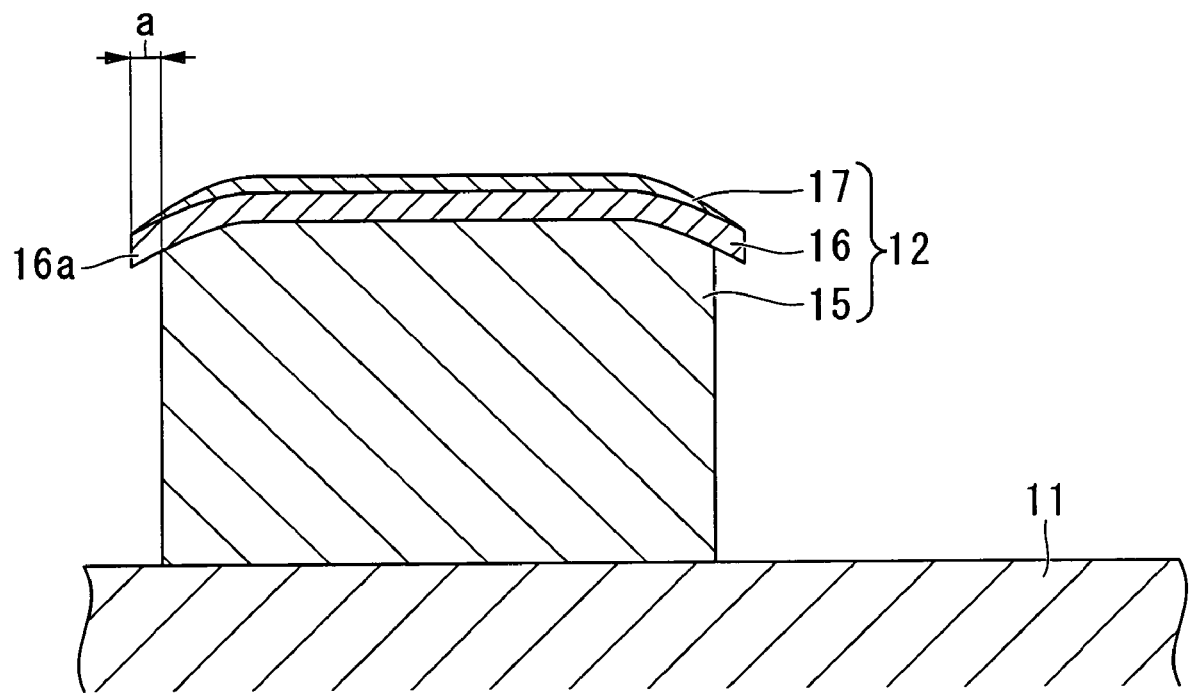
FIG. 4 is a cross section showing an electrode formed on an insulating substrate.

When the electrode 12 is an upper electrode 12b, the vertical-direction positional relationship of the insulating substrate 11, electrode 12, and thermoelectric element 13 are inverted from the vertical-direction state in FIG. 3. The thickness of the copper layer is set to 50 µm, the thickness of the nickel layer 16 is set to 4 µm, and the thickness of the gold layer 17 is set to 0.3 to 0.4 µm. The protrusion length a of the visor portion 16a shown in FIG. 4 is set to from 1 to 5 µm. As the solder 18, a solder of tin and antimony is used.

Next, a method of manufacture of a thermoelectric module 10 configured as described above is explained. The thermoelectric module 10 is manufactured by a manufacturing method having the processes shown in FIG. 5 and FIG. 6. In this case, a seed layer (not shown) consisting of a chromium layer and a copper layer is first formed on the upper surface of the insulating substrate 11 by sputtering (a method in which a high direct-current voltage is applied to an insulating substrate 11 and a target (of the material used to deposit the layer, in this case, chromium and copper) while introducing argon gas into an vacuum, so that ionized argon gas collides with the target and causes target material to be ejected and deposited on the insulating substrate 11).

Dry film is applied to the upper surface of the seed layer, and using an exposure system (not shown) with prescribed areas masked, the surface is exposed for 120 seconds at an intensity of 150 mJ/cm2, after which development is performed for 2.5 minutes in a sodium carbonate solution at a temperature of 30 C. By this means, a pattern is formed in the resist 19 on the upper surface of the insulating substrate 11, as shown in (a) of FIG. 5. This resist 19 is formed in portions in which, ultimately, electrodes 12 will not be formed on the upper surface of the insulating substrate 11.

Figure 5A:
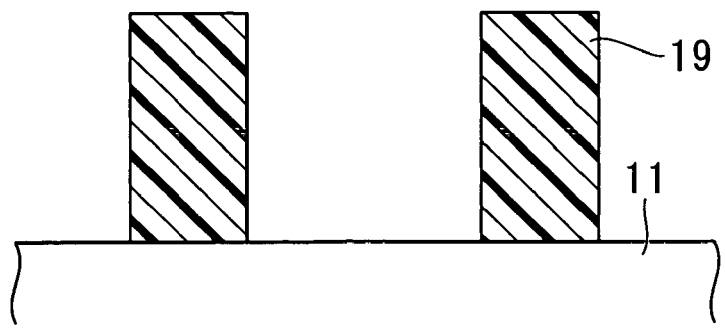
Figure 5B:
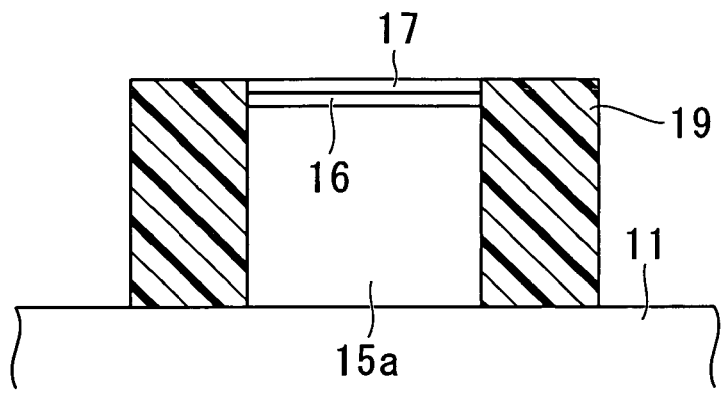
Figure 5C:
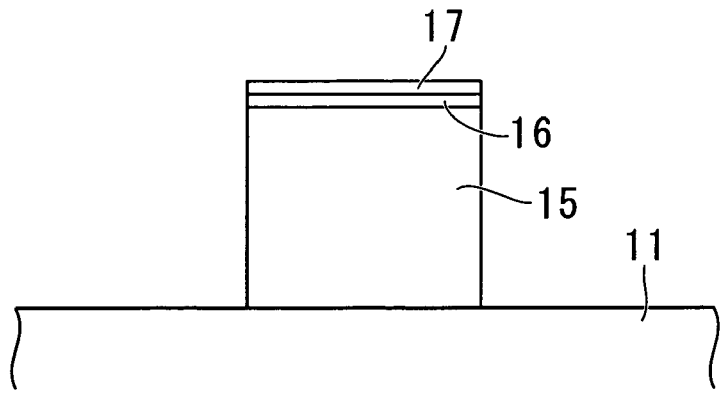

A copper plating solution of 80 g/L of sulfuric acid, 190 g/L of copper sulfate, and 50 ppm of chlorine ions are used to perform plating at room temperature at a current density of 2 A/dm$^2$, to form a copper layer 15a within the resist 19 (see FIG. 5B). The thickness of this copper layer 15a is set to approximately 40 to 100 µm. Then, a nickel plating solution of 240 g/L nickel sulfate, 45 g/L nickel chloride, and 6 g/L boric acid is used to perform plating at a temperature of 55 degrees Celsius at a current density of 2 A/dm$^2$, to form a nickel layer 16 of thickness 4 µm on the upper surface of the copper layer 15a within the resist 19.

Then, the nickel layer 16 is immersed in a plating bath set to a temperature of 55 degrees Celsius, and by passing a current at current density 0.4 A/dm$^2$, a gold layer of thickness approximately 0.3 to 0.4 µm is formed on the upper surface of the nickel layer 16. By this means, as indicated in FIG. 5B, three metal layers, which are a copper layer 15, nickel layer 16, and gold layer 17 are formed within the resist 19. Next, a sodium hydroxide solution is used to remove the resist 19, and ion beam etching (a method in which a specimen is treated by means of the sputtering reaction of an ion beam pulled from an ion source and accelerated) is used to remove the seed layer formed below the resist 19, resulting in the state in FIG. 5C.

Figure 5D:
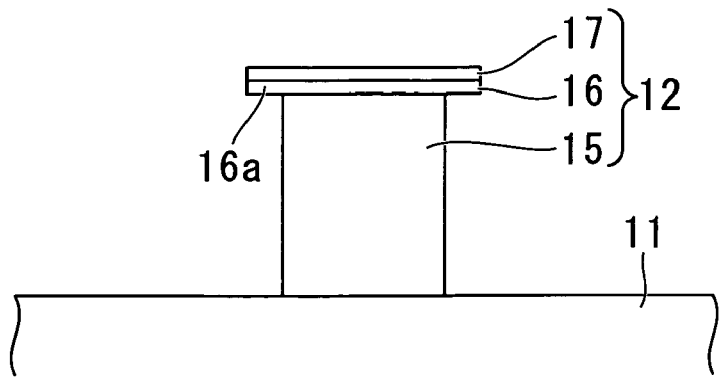

Then, a prescribed thickness is removed by immersing the side-face portion of the copper layer 15a in etching solution for 30 seconds, resulting in the state FIG. 5D. By this means, an electrode 12 consisting of the copper layer 15, the nickel layer 16 with a visor portion 16a, and the gold layer 17 is formed on the prescribed portion of the surface of the insulating substrate 11. Though not shown in the drawing, a seed layer consisting of a chromium layer and a copper layer is formed between the insulating substrate 11 and the copper layer 15; this seed layer is also contained in the electrode 12. The electrodes 12 shown in FIG. 4 and in FIG. 5D are, for convenience of explanation, shown with different shapes; but in substance they are the same.

Next, on the upper face of the electrode 12 formed on the upper surface of the insulating substrate 11 through the processes shown in FIG. 5, a thermoelectric element 13 is positioned, and soldering is performed. Here, first a solder layer, of tin and antimony, is formed on the upper surface of the electrode 12. Then, the end portion of two or of one thermoelectric element is placed on the upper faces of each of the electrodes 12, and a weight or other member is used to maintain this state. In this state, the insulating substrate 11 is then inserted into a reflow furnace (not shown) and heated.

Figure 6:
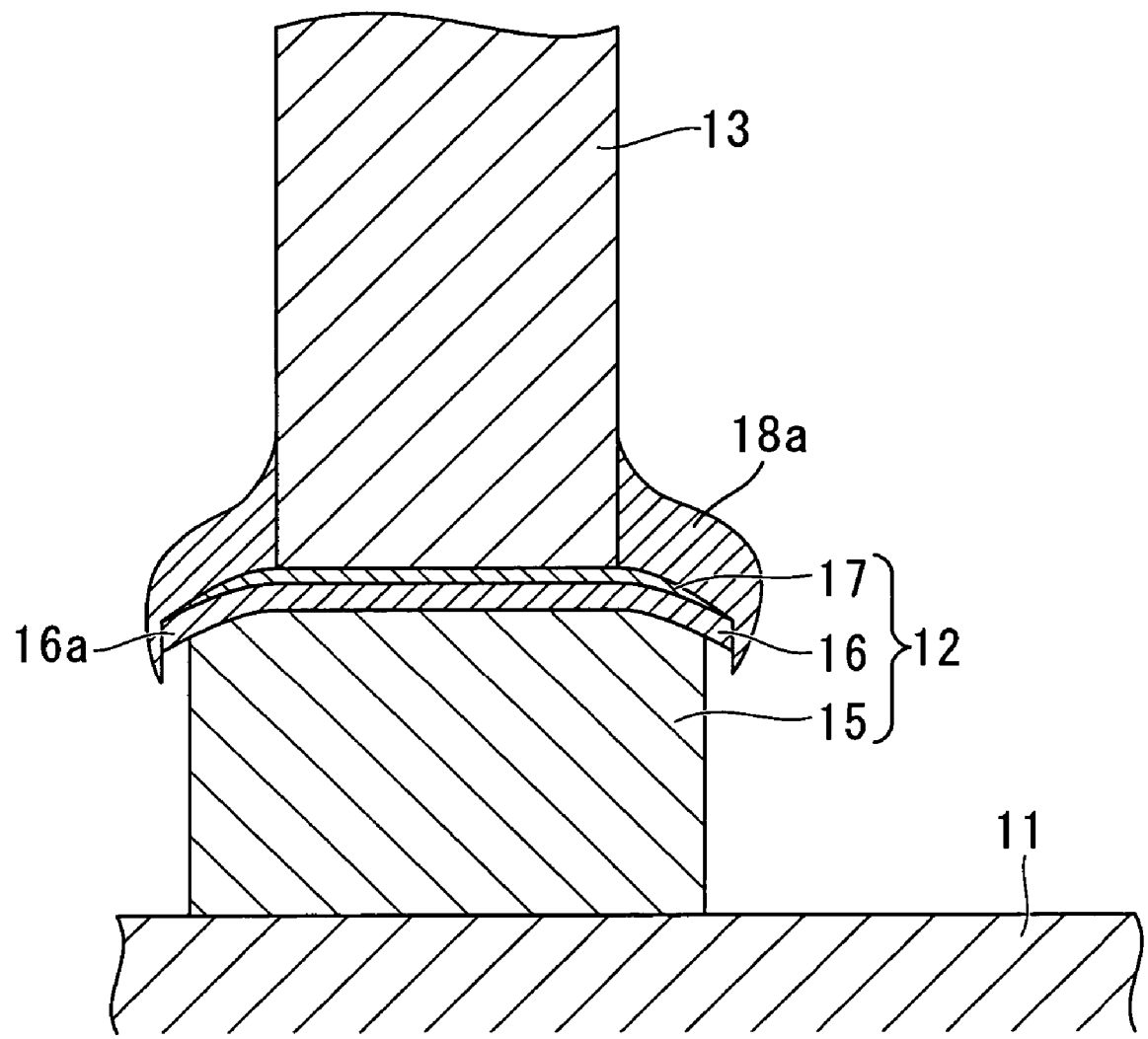
FIG. 6 is a cross section showing the state of an electrode fixed to a thermoelectric element by solder.
Figure 7:
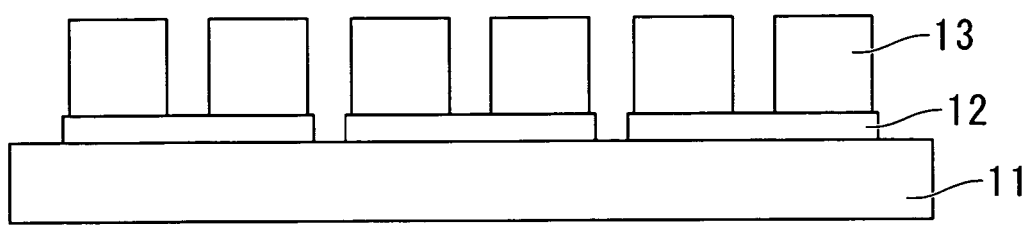
FIG. 7 is a cross section showing thermoelectric elements fixed to the upper faces of electrodes formed on an insulating substrate.

By this means, the solder layer is melted and the state of the solder 18a becomes as shown in FIG. 6. Here, the gold layer 17 of the electrode 12 and the lower-end face of the thermoelectric element 13 are substantially in a state of contact, and the solder 18a is accumulated on the periphery of the bonded portion between the electrode 12 and the thermoelectric element 13. Further, the solder 18a is prevented from dropping by the visor portion 16a. Upon removal from the reflow furnace of the insulating substrate 11 and similar and cooling, the solder 18a shrinks and hardens, assuming the state of FIG. 3. By this means, each of the thermoelectric elements 13 is fixed to the insulating substrate 11 via electrodes 12, resulting in the state of FIG. 7.

When fixing another insulating substrate 11 on the other end portion of the thermoelectric elements 13, electrodes 12 are formed in prescribed portions on the upper surface (after assembly, the lower surface) of the insulating substrate 11, and two solder layers are formed, maintaining an interval between them respectively, on the upper faces of the electrodes 12. The end portions of the thermoelectric elements are then placed on the upper faces of each of the solder layers, and the insulating substrate 11, positioned above the thermoelectric elements 13, is subjected to pressure by a weight or similar, placed into a reflow furnace and heated, followed by external cooling. By fixing in place the lead wires 14a, 14b to a prescribed electrode 12, the thermoelectric module 10 shown in FIG. 1 and FIG. 2 is obtained.

Thus in the thermoelectric module 10 of this aspect, an outward-protruding visor portion 16a is formed in the peripheral portion of the nickel layer 16 contained in the upper-end portions of electrodes 12. Hence when using solder 18 to fix the lower-end portions of thermoelectric elements 13 to the upper faces of electrodes 12 formed on the upper surface of an insulating substrate 11, molten-state solder 18a overflowing from the bonded portion accumulates on the upper face and side face of the visor portion 16a, and dropping of the solder is prevented. By this means, it is possible to prevent the occurrence of short-circuits between electrodes 12 due to hardening of solder 18a which has flowed from different electrodes 12 onto the insulating substrate 11 and made mutual contact.

Moreover, because electrodes are formed from three metal layers which are a copper layer 15, nickel layer 16 and gold layer 17, with a visor portion 16a formed in the nickel layer 16 having less solderability with respect to solder 18, the molten-state solder 18a can be more reliably prevented from passing the visor portion 16a and flowing from the side face portion of the copper layer 15 to the side of the insulating substrate 11. And, according to a method of manufacture of a thermoelectric module 10 of this embodiment, the visor portion 16a can be formed by a simple method. Hence a thermoelectric module 10 can be obtained in which solder 18a is prevented from flowing onto the insulating substrate 11, and short-circuits between electrodes due to solder 18 do not occur.

Figure 8:
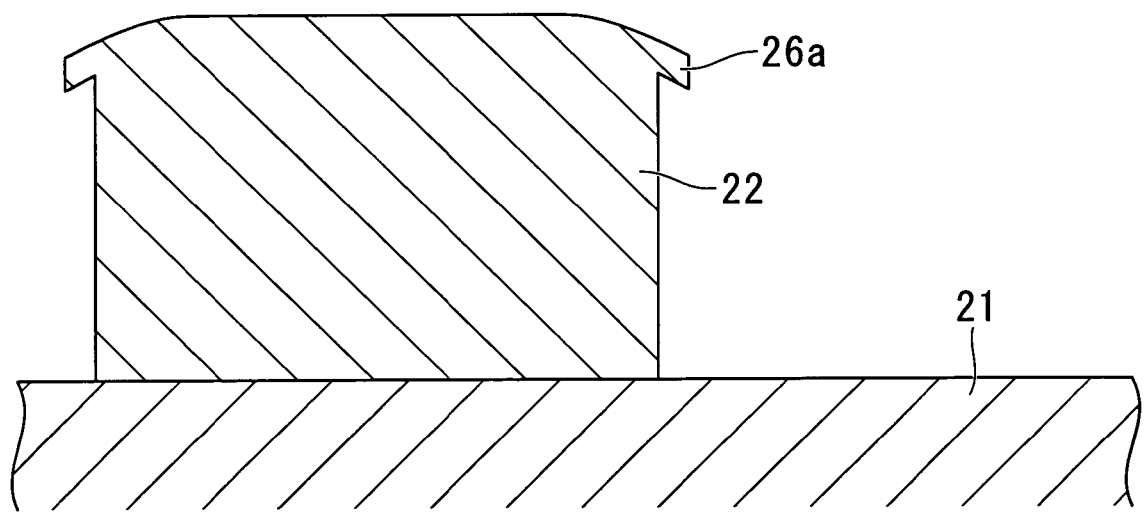
FIG. 8 is a cross section showing an electrode with a thermoelectric element in another embodiment.

FIG. 8 shows a state in which an electrode 22 of a thermoelectric module of another embodiment of the invention is provided on the upper surface of an insulating substrate 21. This electrode 22 consists of a single layer, which is a nickel layer; a visor portion 26a, protruding outward, is formed in the peripheral portion of the upper end. The configuration of other portions of the thermoelectric module having such electrodes 22 is otherwise the same as in the above-described thermoelectric module 10.

Figure 9A:
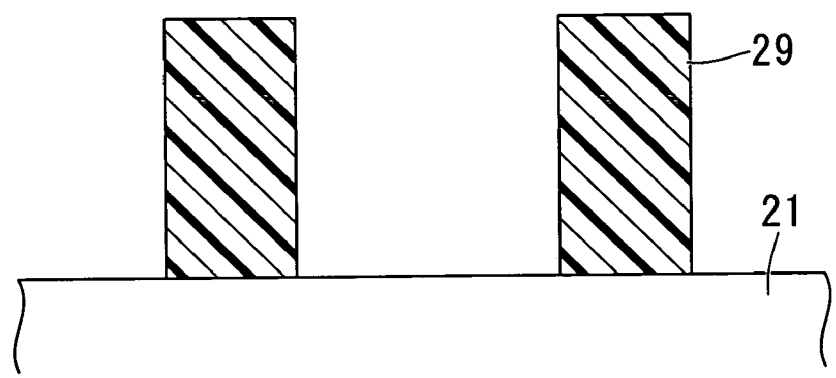
FIG. 9A-C shows processes for formation of the electrode shown in FIG. 8, where
Figure 9B:
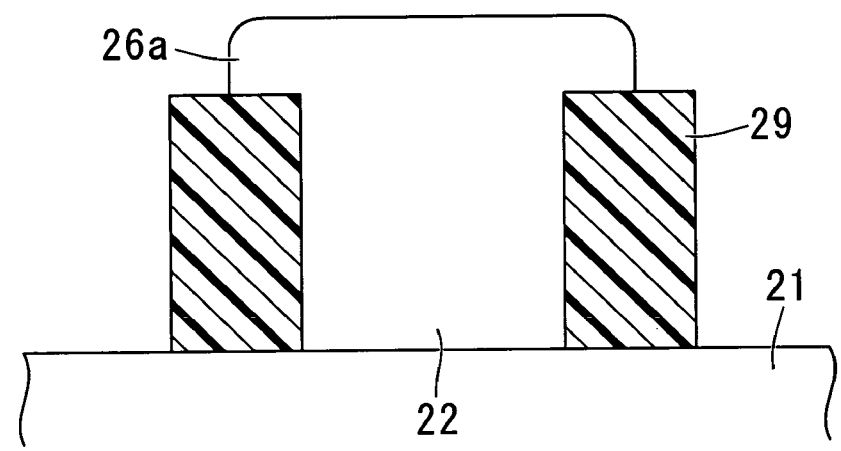

FIG. 9 is used to explain a method of formation of the electrode 22 configured as described above. Here, as indicated in FIG. 9A, processes up to the formation of a pattern in the resist 29 on the upper surface of the insulating substrate 21 are the same as in the above-described embodiment, therefore an explanation is omitted. After formation of this resist, the above-described method is used to form electrodes consisting of a nickel layer within the resist 29. In this case, as indicated in FIG. 5B, the upper-end edge of the electrode 22 is also formed on a portion of the upper face of the resist 29.

Figure 9C:
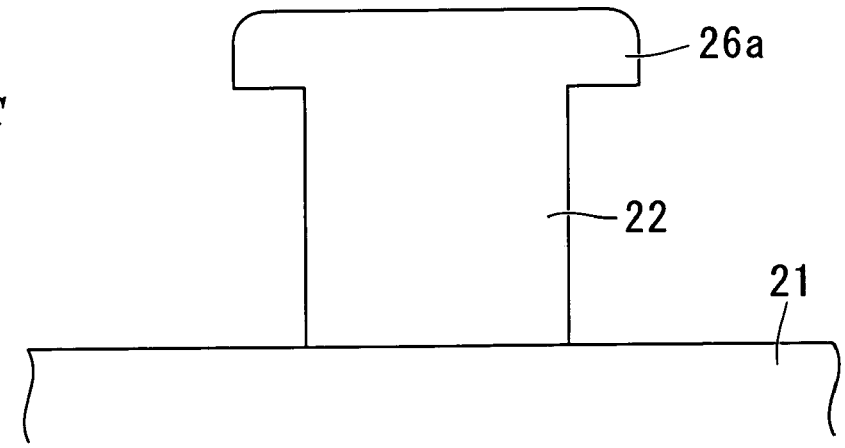

Then, using a sodium hydroxide solution, the resist 29 is removed, and ion beam etching is used to remove the seed layer formed below the resist 29, to obtain the state shown in FIG. 9C. By this means, electrodes 22 consisting of a nickel layer having a visor portion 26a are formed in prescribed portions of the upper surface of the insulating substrate 21. In this case also, a seed layer consisting of a chromium layer and a nickel layer is formed between the insulating substrate 21 and the nickel layer of the electrodes 22. The method of fixing the electrodes 22 and thermoelectric elements 13 in place by soldering is the same as in the above-described embodiment, and so an explanation is omitted.

Thus in a thermoelectric module of this embodiment the number of processes to form electrodes 22 is greatly reduced, so that thermoelectric modules can be easily manufactured, and in addition costs can be reduced. According to this method of manufacture of thermoelectric modules, the flowing of solder onto the insulating substrate 21 can be prevented by a still simpler method, and a thermoelectric module can be obtained in which short-circuits between electrodes 22 due to solder do not occur.

Figure 10:
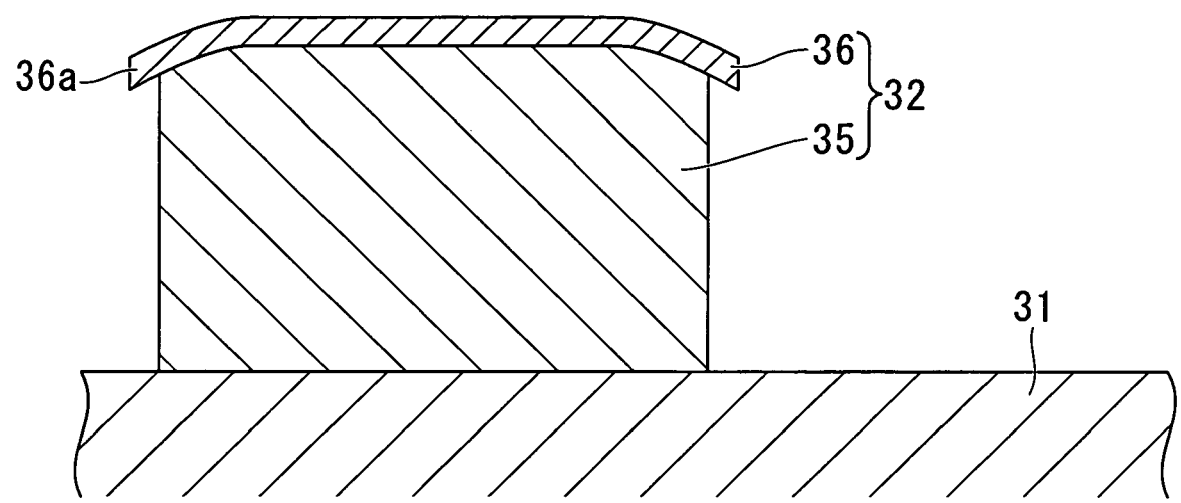

Regarding another embodiment of the present invention, FIG. 10 shows a state in which an electrode 32 of the thermoelectric module is provided on the upper surface of an insulating substrate 31. This electrode 32 consists of two metal layers, which are a magnesium layer 36 formed on the upper face of a copper layer 35; a visor portion 36a, protruding outward, is formed on the outer side of the periphery of the magnesium layer 36. The configuration of other portions of the thermoelectric module having these electrodes 32 is otherwise the same as the above-described thermoelectric module 10.

Formation of this electrode 32 omits formation of the gold layer 17 in the formation method illustrated in FIG. 5, and in place of formation of the nickel layer 16, a magnesium layer 36 is formed; otherwise the method is the same as the formation method shown in FIG. 5, and an explanation is omitted. When forming this electrode 32 also, the number of processes to form the electrode 32 is reduced, so that the thermoelectric module can easily be manufactured, and costs can be reduced. Further, by means of this thermoelectric module manufacturing method, a simple method can be used to prevent the flowing of solder onto an insulating substrate 31 and to obtain a thermoelectric module in which short-circuits between electrodes 32 due to solder do not occur.

Thermoelectric modules and manufacturing methods of this invention are not limited to the above-described embodiments, and various appropriate alterations are possible. For example, the electrode 12 of an above-described embodiment consists of three metal layers, with a visor portion 16a provided in the nickel layer 16 which is formed as the second layer; however, this visor portion can be formed in the uppermost metal layer. In this case, the thickness of the uppermost metal layer is set to 1 μm or greater.

In the electrode 32, a visor portion 36a is provided in the upper-portion magnesium layer 36; but the visor portion may instead be provided in the upper-end edge portion of the copper layer 35, positioned below the magnesium layer 36. Further, the magnesium layer 36 and the visor portion 36a in the electrode 32 may be formed integrally as the same layer with substantially the same thickness; or, the lateral cross-section of the lower-side portion of the magnesium layer 36 may be made the same as the lateral cross-section of the copper layer 35, with the visor portion 36a formed at the edge of the upper end of the magnesium layer 36.

Further, electrodes may be formed from three or more layers, and in this case the metal materials used in the different layers may be selected and used as appropriate. For example, two layers may be formed on top of a copper layer, one layer consisting of nickel and magnesium, the other layer of gold, tin, a tin alloy, or similar, with the visor portion formed at the edge of this second layer. In this case, the copper layer portion may be formed as two layers, with the other layer formed from a metal other than copper. In addition, the layer in which the upper visor portion is formed may be a single layer, and the layer in the lower portion may consist of two or more layers.

In the method of formation of electrodes 22 shown in FIG. 9, electrodes can also be formed from a plurality of layers. And, the material used as the solder 18 is not limited to tin and antimony, but can consist of tin and gold, tin and lead, and similar. The configurations of the other portions in each of the above-described embodiments can also be modified as appropriate, within the technical scope of this invention.

What is claimed is:

1. A thermoelectric module, comprising:
   a pair of insulating substrates arranged in opposition;
   electrodes which are formed at prescribed locations on opposing inside surfaces of said insulating substrates, each of said electrodes includes at least a first layer and a second layer;
   a plurality of thermoelectric elements whose edge faces are soldered to respective opposing electrodes to fix in place said thermoelectric elements between said pair of insulating substrates: and
   a visor portion located where said thermoelectric elements and respective electrodes are joined, said visor portion protruding radially outward from peripheral surfaces of said electrodes,
   whereby a solder is prevented from flowing from said peripheral surfaces of said electrodes to said insulating substrates when said thermoelectric elements positioned on upper sides of said electrodes are soldered to said electrodes,
   wherein said first layer of said each electrode is formed on a surface of one of said insulating substrates,
   wherein the second layer is formed on said first layer and forms said visor portion, and
   wherein a step is formed between said first layer and said second layer.

2. The thermoelectric module according to claim 1, wherein:
   said electrodes comprise a plurality of layers, including said first layer and said second layer, made of different types of metals; and
   said visor portion is formed as one of said metal layers with less solderability with respect to solder among said plurality of metal layers.

3. The thermoelectric module according to claim 1, wherein:
   said electrodes comprise three layers, including the first layer and the second layer, which are a copper layer formed on one surface of said insulating substrates, a nickel layer formed on one surface of said copper layer, and a gold layer formed on one surface of said nickel layer; and
   said visor portion is formed in said nickel layer.

4. A thermoelectric module comprising:
   a pair of insulating substrates arranged in opposition;
   electrodes formed at prescribed locations on opposing inside surfaces of said insulating substrates;
   a plurality of thermoelectric elements whose edge faces are soldered to respective opposing electrodes to fix in place said thermoelectric elements between said pair of insulating substrates; and
   a visor portion located where said thermoelectric elements and respective electrodes are joined, said visor portion protruding radially outward from peripheral surfaces of said electrodes,
   whereby a solder is prevented from flowing from said peripheral surfaces of said electrodes to said insulating substrates when said thermoelectric elements positioned on upper sides of said electrodes are soldered to said electrodes,
   wherein said electrodes comprise a single layer of one type of metal.

5. The thermoelectric module according to claim 1, wherein thickness of a root end and a protruding length of said visor portion are respectively set to 1 μm or greater.

6. The thermoelectric module according to claim 1, wherein a protruding length of said visor portion is respectively set to 1-5 μm or greater.

* * * * *